United States Patent [19]

McCown et al.

[11] Patent Number: 5,002,418
[45] Date of Patent: Mar. 26, 1991

[54] HOLD DOWN DEVICE WITH EXTENDED CAPTURE PAWL MECHANISM

[75] Inventors: William R. E. McCown, Montclair; John C. Stammreich, Rancho Palos Verdes; William R. Bourne, Jr., Redondo Beach, all of Calif.

[73] Assignee: VSI Corporation, Chantilly, Va.

[21] Appl. No.: 282,393

[22] Filed: Dec. 9, 1988

[51] Int. Cl.⁵ .......................... F16D 1/00; F16B 1/00
[52] U.S. Cl. ..................................... 403/24; 403/349; 403/353; 24/592; 24/594; 24/287; 410/82
[58] Field of Search ................ 403/348, 349, 353, 24; 24/287, 592, 594, 591, 590; 410/76, 77, 80, 82

[56] References Cited

U.S. PATENT DOCUMENTS

| 1,130,726 | 3/1915 | Greve | 403/348 X |
|---|---|---|---|
| 2,745,303 | 5/1956 | Cornelius . | |
| 2,921,634 | 1/1960 | Blondoff | 403/349 X |
| 2,922,211 | 1/1960 | Boyd . | |
| 2,978,266 | 4/1961 | Poe . | |
| 3,212,746 | 10/1965 | Wright . | |
| 3,255,796 | 6/1966 | Tobey . | |
| 3,640,141 | 2/1972 | Hollingsead et al. . | |
| 3,691,595 | 9/1972 | Backteman et al. | 24/287 |
| 3,734,444 | 5/1973 | Thorngate . | |
| 3,796,985 | 3/1974 | Weber . | |
| 3,854,832 | 12/1974 | Cowper | 403/349 |
| 3,866,878 | 2/1975 | Yamamoto . | |
| 3,945,744 | 3/1976 | Metz | 403/349 X |
| 4,018,091 | 4/1977 | Hollingsead et al. . | |
| 4,459,785 | 7/1984 | Zimmer | 403/348 X |
| 4,506,439 | 3/1985 | Roake . | |
| 4,534,234 | 8/1985 | Cosenza . | |
| 4,614,443 | 9/1986 | Hamert | 403/349 X |
| 4,830,530 | 5/1989 | Meineke | 403/12 |

FOREIGN PATENT DOCUMENTS 2112587 9/1972 Fed. Rep. of Germany .
3642399 6/1988 Fed. Rep. of Germany ........ 410/82

OTHER PUBLICATIONS

NASA Tech. Brief, No. 68-10512, Nov. 1968.
Machine Design, date unknown, p. 46, "Scanning for Ideas".

Primary Examiner—Randolph A. Reese
Assistant Examiner—Carol I. Bordas
Attorney, Agent, or Firm—Poms, Smith, Lande & Rose

[57] ABSTRACT

A hold down device is provided using a drive knob having a clutch therein which turns a drive shaft for moving a pawl shaft in and out with respect to the drive shaft. A pawl on the end of the pawl shaft is provided with a cam-like surface which engages a cam-like aperture in a pawl receptacle. The pawl shaft has a cam follower which rides within a cam surface in a cam bracket that surrounds the shaft. Under the urging of a spring, the position of the pawl is controlled from its fully extended, unlocked position to a pre-capture position where the pawl is oriented at approximately 45° to an aperture within the pawl receptacle. Insertion of the pawl into the pawl receptacle forces the pawl to rotate an additional 45° against the urging of the spring. After full insertion of the pawl into the receptacle, the pawl rotates back to its 45° position where it is captured therein. Further tightening of the knob will move the pawl to a locked, preload position under the control of the cam surface within the cam bracket.

19 Claims, 6 Drawing Sheets

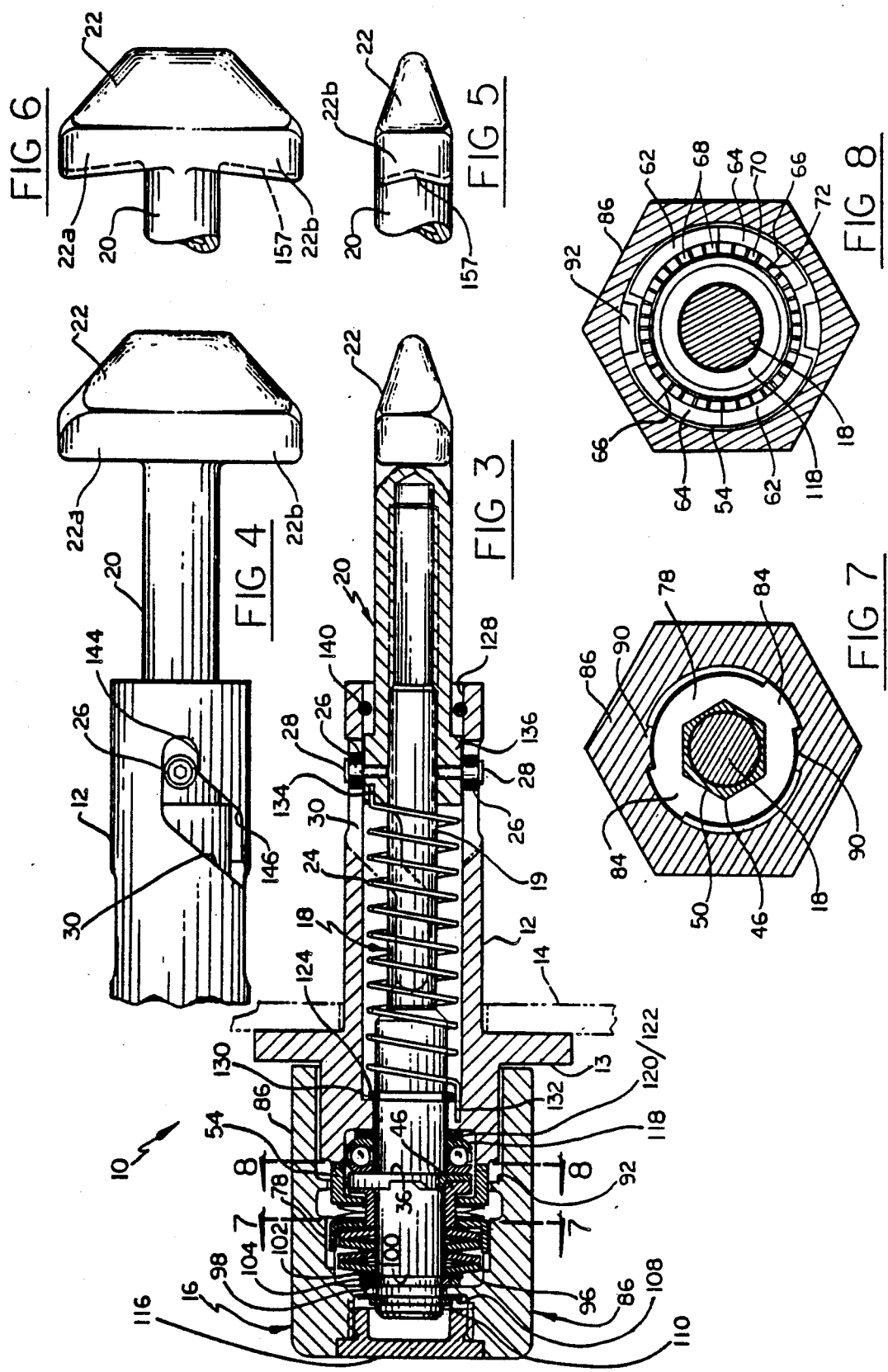

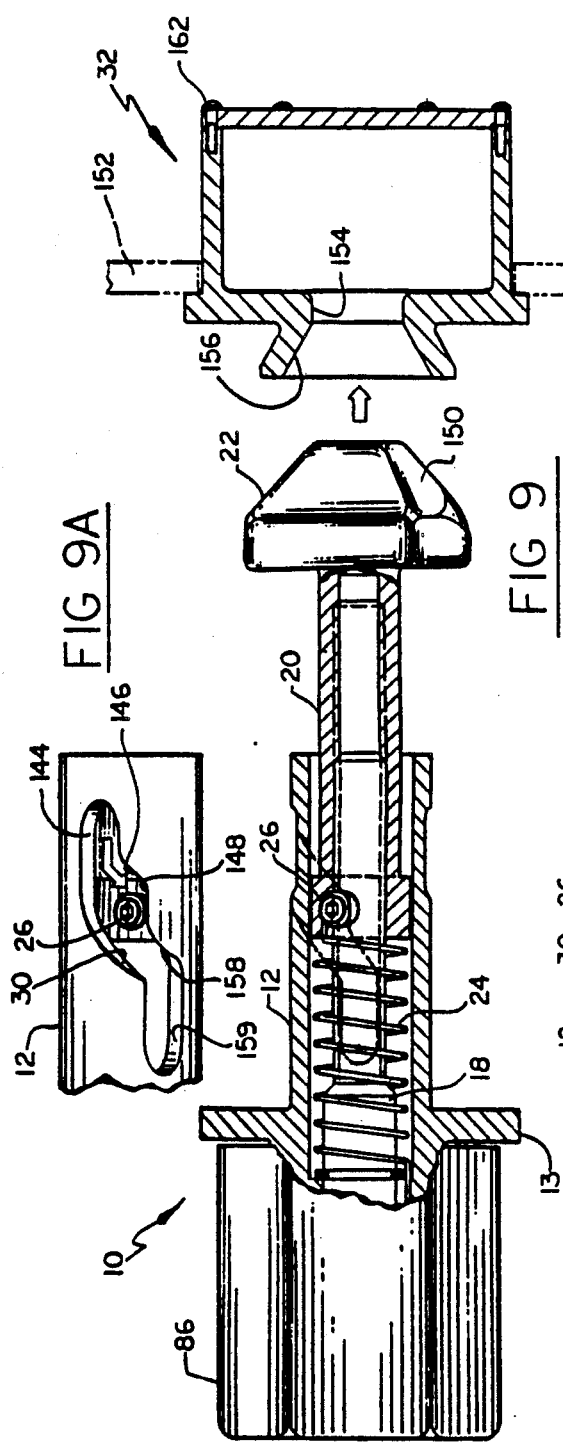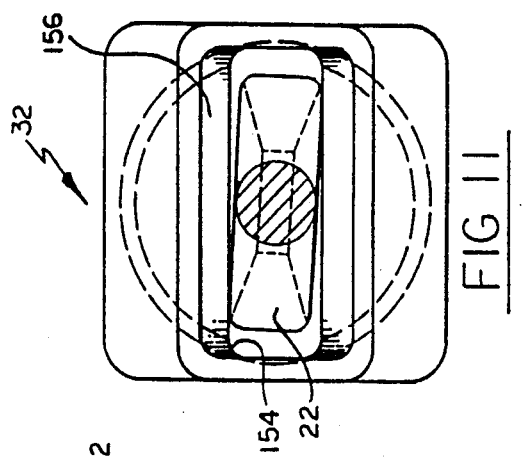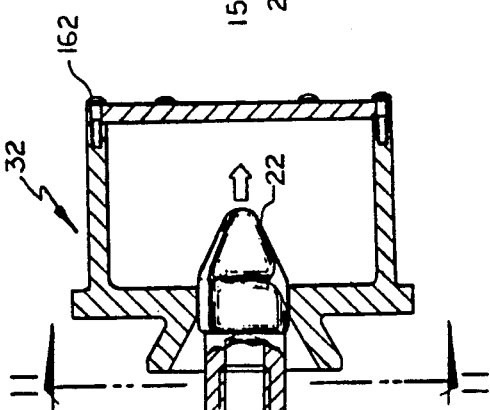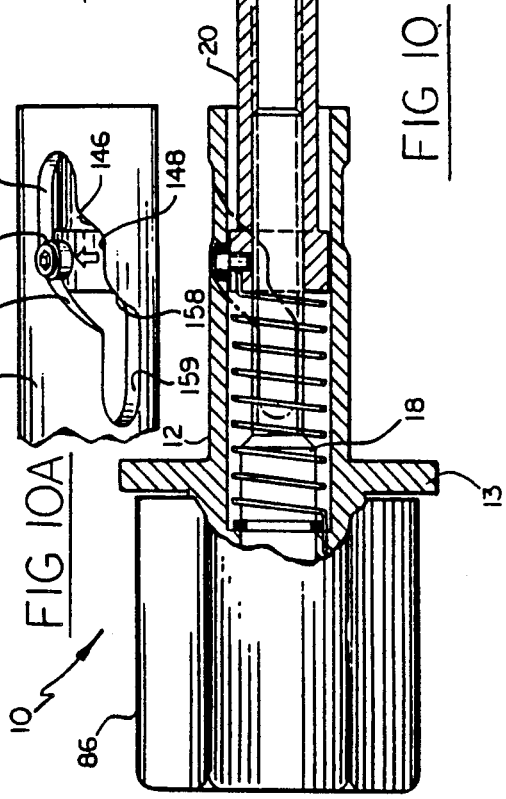

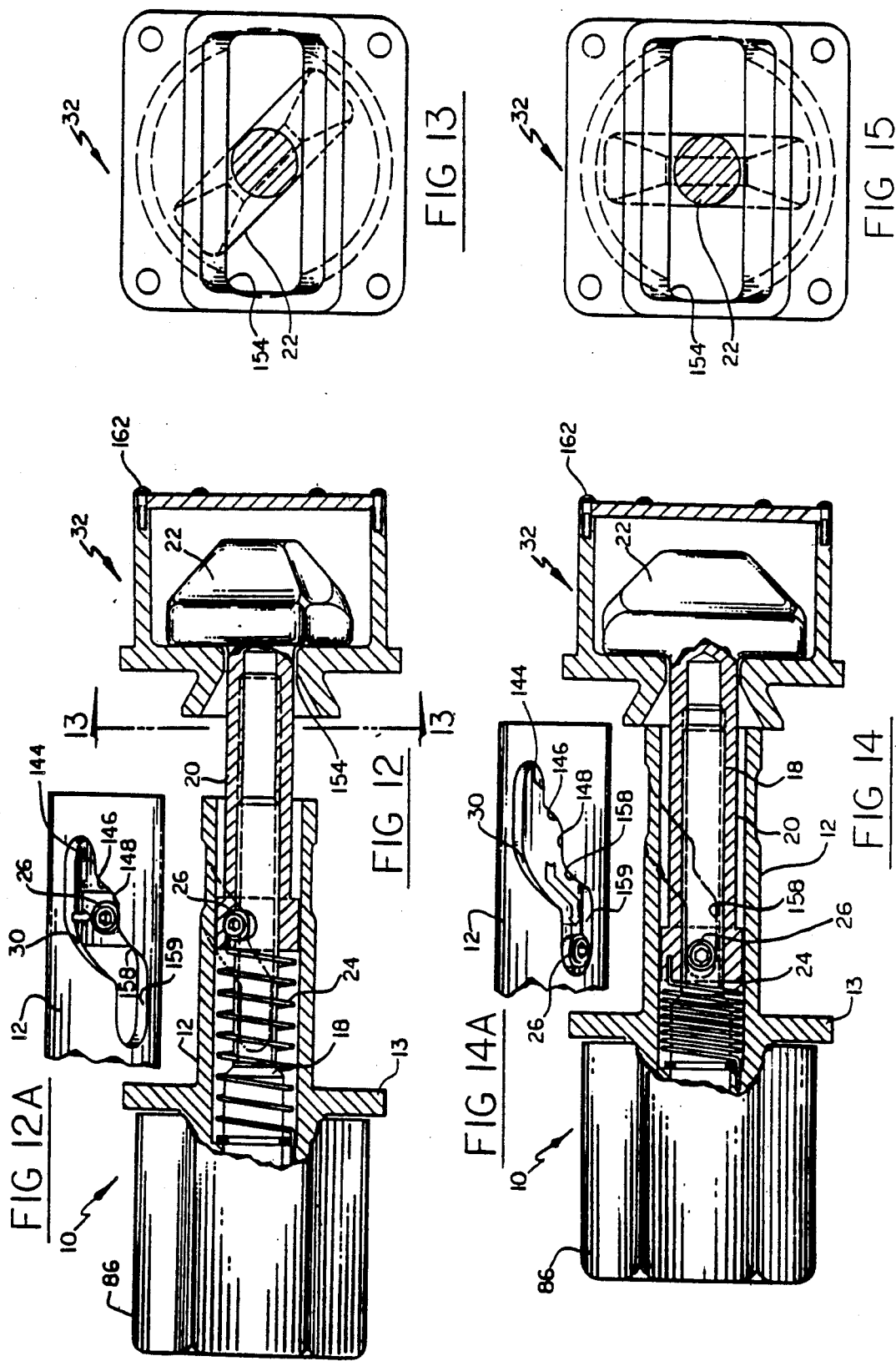

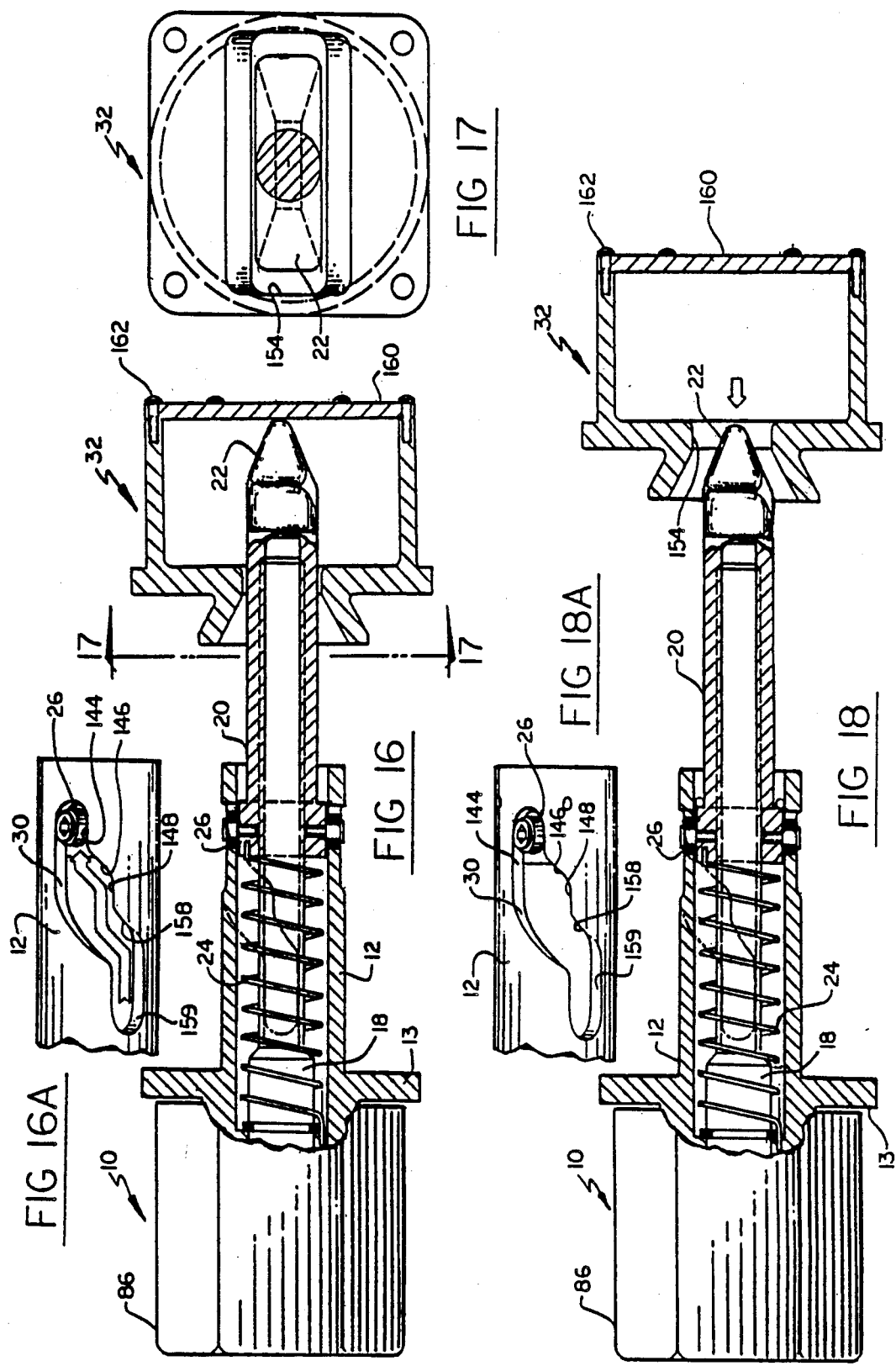

HOLD DOWN DEVICE WITH EXTENDED CAPTURE PAWL MECHANISM

BACKGROUND OF THE INVENTION

1. Field of the Invention

The present invention relates to a hold down device and, more particularly, to a device that may be used on equipment packages or chassis that are intended to be removably mounted upon equipment racks. The hold down device has a capture feature which permits it to easily engage a receptacle in the rack, capture that receptacle, and then lock to the receptacle.

2. Description of the Prior Art

The use of hold down devices to secure an equipment package to a rack is well-known in the prior art. Such a device is shown in U.S. Letters Pat. No. 3,866,878, issued Feb. 18, 1975, by A. K. Yamamoto, entitled UNITARY LOCK NUT ASSEMBLY which is assigned to Tridair Industries. This hold down device is used to secure a package or chassis to a rack where the hold down device is connected to the rack by a clevis pin that permits the device to pivot into engagement with a hook on the chassis. This type of hold down device is often used for ground mounted and airborne equipment.

Other types of hold down devices are designed for use in airborne equipment. These include a quick release fastener which accomplishes the fastening function with but a quarter turn. Such a device is shown in U.S. Letters Pat. No. 2,922,211 which issued Jan. 26, 1960, by T. R. Boyd.

In space applications, it is desirable to have a quick release fastener with a positive latch feature for mounting orbital replaceable units (ORU) to an orbiting space platform. One device for such space applications is shown in a NASA technical brief, Brief 68-10512, issued in November 1968.

The positive-latch fastener shown in the NASA technical brief referred to above is capable of making a connection between a orbit replacement unit (ORU) and a space platform. However, the NASA fastener does not provide a simple arrangement for making the initial connection or capture between the ORU and the space platform.

SUMMARY OF THE INVENTION

Accordingly, it is an object of the present invention to provide an improved hold down device with capture capabilities.

It is a further object of the present invention to provide a hold down device with capture capabilities that is astronaut or robot friendly.

A still further object of the this invention is to provide a hold down device which may be used to capture an electrical chassis to its rack, securely lock the chassis to the rack with a controlled preload therebetween, provide for positive locking and unlocking and generate a push-off force after unlocking.

These and other objects are accomplished by providing a drive assembly that includes a clutching mechanism for driving a shaft having a pawl at its opposite end. A spring urges the shaft and pawl into a pre-capture position The pawl is received by a pawl receptacle which urges the shaft and pawl through a transition position against the torsional force of the spring, and into a capture position as the pawl passes into the pawl receptacle Thereafter, the drive assembly draws the shaft and pawl into a locking position within the pawl receptacle.

BRIEF DESCRIPTION OF THE DRAWINGS

A better understanding of the present invention and further objects and advantages thereof will become apparent to those skilled in the art after consideration of the following specification and drawings, wherein:

FIG. 3 is a side view, shown in cross section, which illustrates the hold down device in a fully extended or unlocked position;

FIG. 4 is a partial top view of FIG. 3;

FIG. 5 is a side view showing a second embodiment of the pawl of FIG. 3;

FIG. 6 is a top view of the pawl shown in FIG. 5;

FIG. 7 is a cross-sectional view taken along lines 7—7 of FIG. 3;

FIG. 8 is a cross-sectional view taken along lines 8—8 of FIG. 3;

FIG. 9 is a side, partially cross-sectional view, similar to FIG. 3, showing the hold down device and pawl receptacle of the present invention in a pre-capture position;

FIG. 9A is a partial top view showing the cam bracket of FIG. 9;

FIG. 10 is a side, cross-sectional view similar to FIG. 9 showing the hold down device in its transitional FIG. 10A is a partial top view of the cam bracket of FIG. 10;

FIG. 11 is a view taken along lines 11—11 of FIG. 10;

FIG. 12 is a side, partial cross-sectional view of the hold down device shown in the capture position;

FIG. 12A is a partial top view of the cam bracket shown in FIG. 12;

FIG. 13 is a view taken along lines 13—13 of FIG. 12;

FIG. 14 is a side, partial cross-sectional view showing the hold down device in its fully locked position;

FIG. 14A is a partial top view of the cam bracket of FIG. 14;

FIG. 15 is a side view, similar to FIG. 13, of the pawl receptable and pawl as shown in FIG. 14;

FIG. 16 is a side, partial cross-sectional view of a hold down device in its nearly extended position exerting a push-out force against the pawl receptacle;

FIG. 16A is a partial top view of the cam bracket shown in FIG. 16;

FIG. 17 is a view taken along lines 17—17 of FIG. 16;

FIG. 18 is a side view, similar to FIG. 16, showing the hold down device disengaging from the pawl receptacle; and FIG. 18A is a partial top view showing the cam bracket of FIG. 18.

DESCRIPTION OF THE PREFERRED EMBODIMENTS

Figure 1:
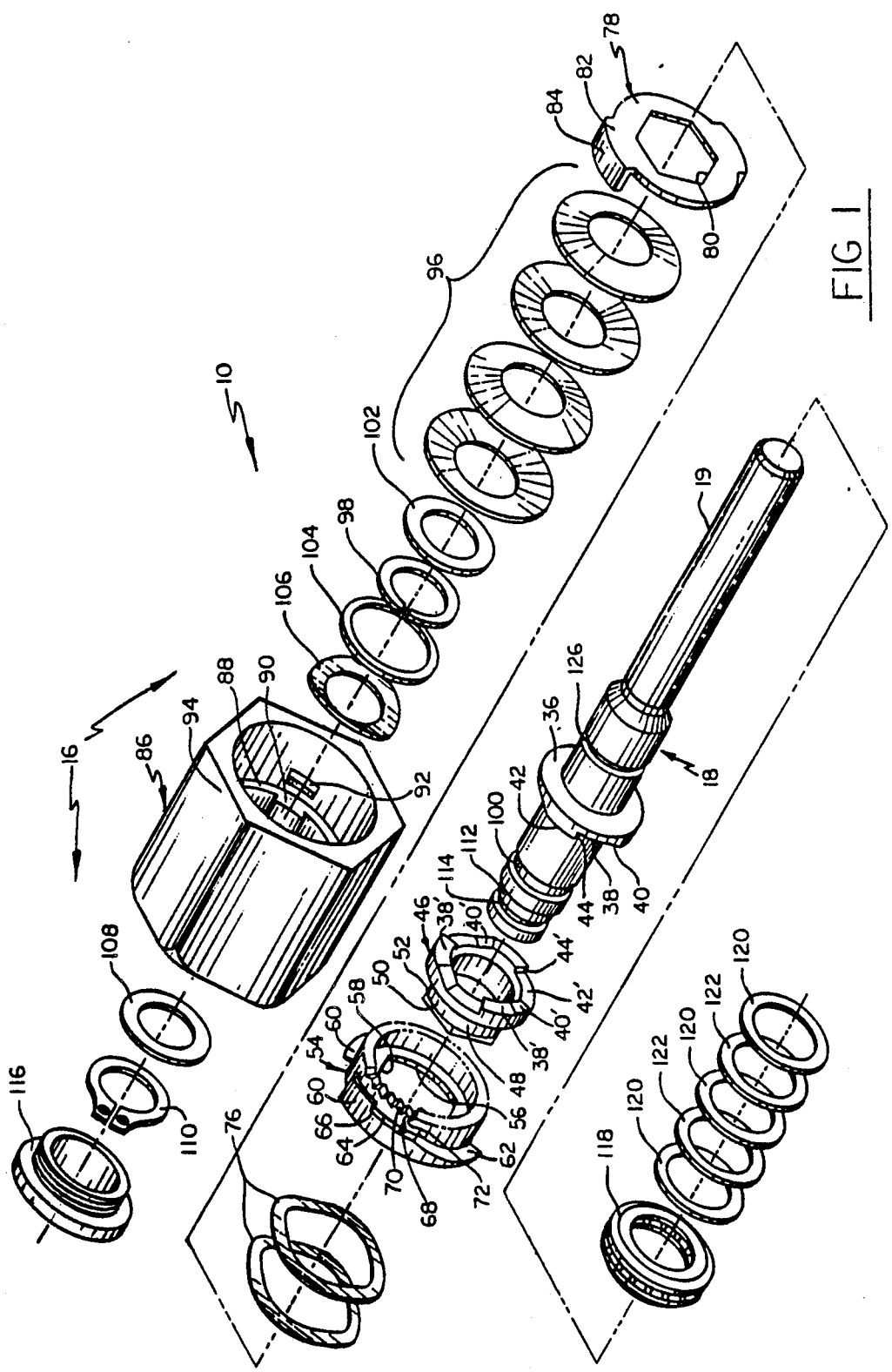
FIG. 1 is an exploded view, shown in perspective, illustrating the various components which make up the hold down including its drive assembly.
Figure 2:
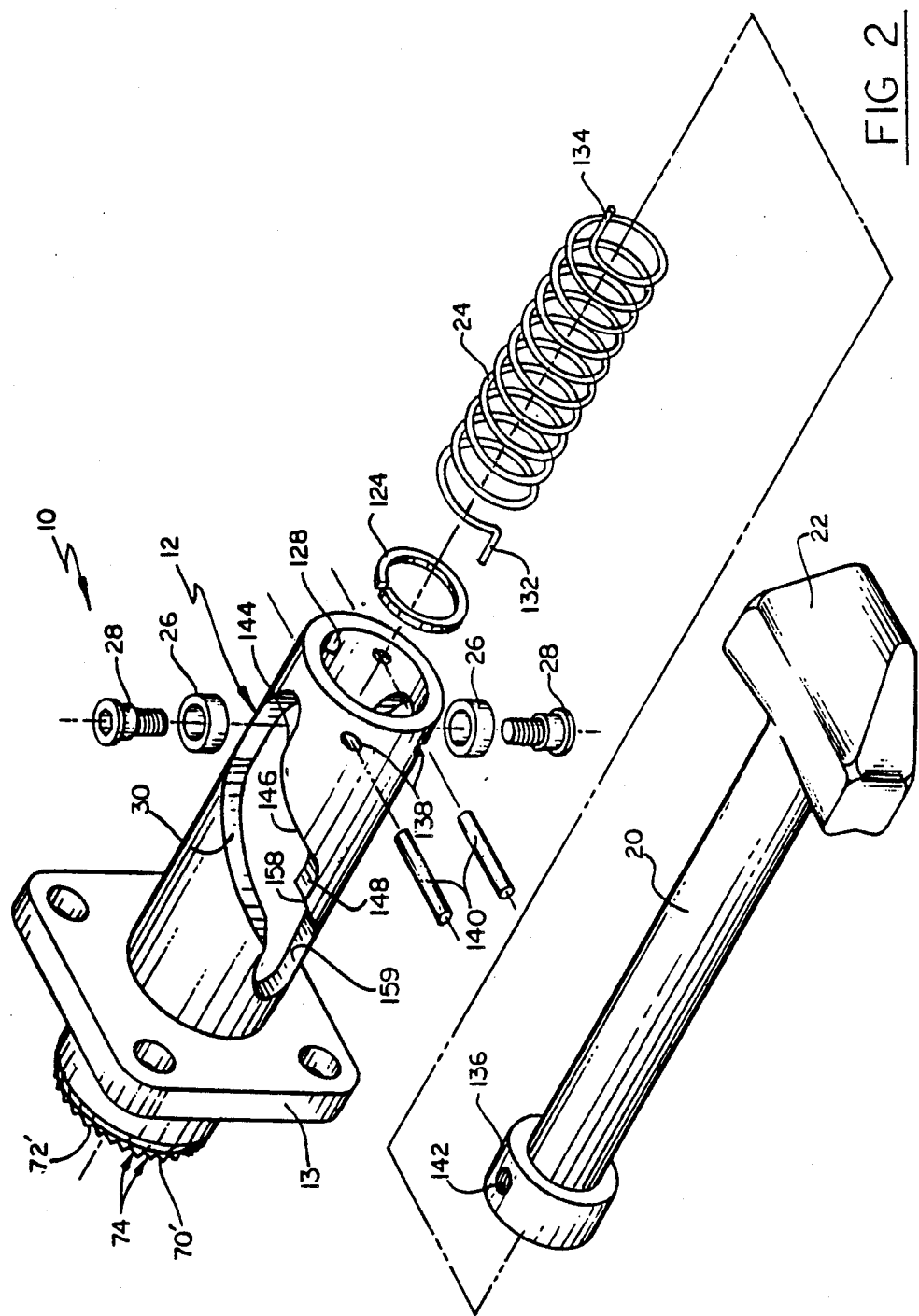
FIG. 2 is an exploded view, shown in perspective, illustrating the continuation of the hold down device shown in FIG. 1 and further showing the capture pawl mechanism.

Referring now to the drawings, a hold down device with an extended capture pawl mechanism is shown generally at 10 in FIGS. 1-3. The main components of the hold down device 10 include a cam bracket 12 having a mounting flange 13 that may be fixed to a chassis or orbit replacement unit shown schematically at 14, as by fasteners, such as rivets. At one end of the cam bracket 12 is mounted a drive assembly 16 which includes a drive shaft 18 passing through the center of the generally cylindrical, tubular cam bracket 12. The drive shaft 18 is externally threaded at 19 to receive a pawl shaft 20. The pawl shaft 20, in turn, is internally threaded (not shown) along its longitudinal axis and has a pawl 22 at one end. A torsional compression spring 24 is placed within the cam bracket 12 and surrounds the drive shaft 18 for joining the cam bracket 12 to pawl shaft 20.

Extending from the sides of the pawl shaft 20 is at least one roller cam 26 secured thereto by a threaded and shouldered stud 28. The stud 28 retains the cam 26 within a camming surface 30 formed in the sidewalls of the cylindrical, tubular cam bracket 12. The major portions of the hold down device 10 further include a pawl receptacle 32, first shown in FIG. 9.

Referring now to FIGS. 1 and 2, the hold down device with extended capture pawl mechanism 10 is shown in exploded detail. The drive assembly 16 is mounted to one end of the drive shaft 18 whose opposite end 19 receives the pawl shaft 20. Between the drive assembly 16 and the threaded portion 19 of shaft 18 is a clutch plate 36 which extends perpendicularly from the longitudinal axis of the shaft 18. The clutch surface of plate 36 is formed with a camming element on the surface opposite to threads 19 which consists of three flat surfaces 38 parallel to the plane of the clutch plate, three surfaces 40 which are angled or ramped with respect to the flats 38, and three additional surfaces 42 that are flat and parallel to surfaces 38. The interfaces between surfaces 38 and 42 are near perpendicular to the plane of the clutch plate 36 to form three stop surfaces 44. Alternately, these stop surfaces 44 may be arranged at a small or slight angle to provide a clutch relief when the drive assembly 16 is turned too far in the unlocking direction, as will be discussed below.

Next assembled upon the drive shaft 18 is a clutch drive disc 46 which is ring-shaped having an inner diameter that slides over the outer diameter of shaft 18 with a clutch plate engaging surface substantially identical to the surface of clutch plate 36 including three flats 38', three ramps 44', three additional flats 42', and three stop surfaces 44'. A cylindrical member 48 extends from the opposite surface of the clutch face on clutch drive disc 46 having an outermost end provided with a plurality of flats 50 which form, for example, a hex. One or more of the flats 50 extend up the cylindrical surface 48 at 52 to provide a sliding surface for a ratchet cam 54.

The ratchet cam 54 is cup-shaped with its internal bottom surface having an aperture 56 with opposing flats 58. The aperture 56 receives the cylinder member 48 of clutch drive disc 46 with the flats 58 of ratchet cam 54 sliding over the flats 52 of the clutch drive disc 46 for prohibiting rotational motion between the two elements while permitting a linear, sliding motion along the longitudinal axis of the hold-down device 10. Note that the outer surface of ratchet cam 54 is provided with a pair of extending cams 60 which include a first ramped portion 62, a flat portion 64, parallel to a plane which passes perpendicularly through the longitudinal axis of the ratchet cam 54, and a stop surface 66 that is perpendicular to the flat surface 64. A plurality of ratchet teeth 68 are found on the ring-like edge of the ratchet cam 54 facing the clutch plate 36 and clutch drive disc 46. These teeth 68 are each provided with a ramped surface 70 and a stop surface 72 that is near parallel to the longitudinal axis of ratchet cam 54. The ratchet teeth 68 pass over the clutch drive disc 46 and clutch plate 36 to interface with ratchet teeth 74 located on the outer edge of the cam bracket 12 (FIG. 2) wherein the ratchet teeth 74 have ramped surfaces 70' and stop surfaces 72'.

After the clutch drive disc 46 and ratchet cam 54 have been slid over each other and then over clutch drive shaft 18, a pair of spring washers 76 are placed between ratchet cam 54 and a drive plate 78. Note that drive plate 78 has a hexagonally shaped aperture 80 which receives the hexagonally shaped end 50 of clutch drive disc 46. Also note that the drive plate 78 is generally cylindrical with two extending tabs 82 that support two drive plate stops 84 formed from sections of an outer surface of a hollow cylinder. It will be seen that the arcuate stops 84 fit within a knob 86 and further fit within the inner diameter of a shouldered section 88 therein. The shouldered section 88 of knob 86 has inwardly extending stop shoulders 90 (two are shown in the preferred embodiment of FIG. 1) which engage the stops 84 to limit rotation of drive plate 78, as will be described hereinbelow. The internal structure of the knob 86 is completed by two or more inwardly extending cam engaging lugs 92 which fit between and engage the cam surfaces 62 of cams 60 on ratchet cam 54. The outer surface of knob 86 may be provided with a series of flats 94 to form a hex which may be engaged for turning by either finger pressure or a wrench, as desired.

Mounted between drive plate 78 and knob 86 are belleville spring washers 96 (four are used in the preferred embodiment) which are engaged between the outer, end surface on the cylindrical member 48 of the clutch drive disc 46 and a retaining ring 98 which snaps into a groove 100 in shaft 18. As seen in FIG. 3, additional shim washers 102 may be used for spacing between the retaining ring 98 and the belleville washers 96. A retaining ring captivator 104 may also be used externally from the retaining ring 98, while a spring washer 106 mounts between the retaining ring 98 and knob 86. A flat washer 108 and a retaining ring 110 fit upon shoulder 112 and within groove 114, respectively, in shaft 18 to attach the knob 86 to shaft 18.

A thrust ball bearing 118 is then slid over the threaded portion 19 of shaft 18 to rest against clutch plate 36. Thereafter, a series of spring washers and flat washers may be mounted on the drive shaft 18 against the bearing 118. In the preferred embodiment, this series includes three spring washers 120 and two alternating flat washers 122.

As seen in FIG. 2, the cam bracket 12 is slid over the threaded portion of shaft 18 so that its ratchet teeth 74 engage the ratchet teeth 68 on ratchet cam 54. In assembling the drive assembly 16, the cam bracket 12 is urged into knob 86 to compress the belleville spring washers 96. Thereafter, a retaining ring 124 is inserted into a groove 126 to complete the drive assembly 16. With the exception of the cam bracket 12, the drive assembly 16 has been substantially described in a copending patent application Ser. No. 146,920, filed Jan. 22, 1988, by William Meineke, entitled Hold-Down Device which is assigned to Rexnord, Inc. and issued on May 16, 1989, as U.S. Letters Pat. No. 4,830,530.

The cam bracket 12, best seen in FIG. 2, includes a cylindrical member which has been bored or drilled to form an inner chamber 128 having a shoulder 130 (FIG. 3) upon which the retaining ring 124 rests. The torsional compression spring 24 is then inserted within the chamber 128 about the shaft 18 and an extending tang 132 is inserted into a drill aperture in shoulder 130. A second tang 134, parallel to the first tang 132 and on the opposite end of spring 24, is inserted into a similar aperture in pawl shaft 20 as that shaft is inserted by turning on threads 19 into the chamber 128.

Pawl shaft 20 includes a collar 136 on the end opposite from the pawl 22. The collar 136 is inserted into chamber 128 beyond a pair of apertures 138 in cam bracket 12 which receive a pair of retaining pins 140 to retain the pawl shaft 20 within chamber 128 against the urging of the spring 24. Thereafter, the pawl shaft 20 is turned against the force of spring 24 to create a torsional preload on shaft 20. The roller cams 26 are then placed within the cutout in the sidewalls of the cylindrical portion of cam bracket 12 which form the cam surfaces 30 and are permanently connected to the pawl shaft 20 by threaded studs 28 inserted within threaded apertures 142 in collar 136 to complete the assembly of the hold down device 10.

In FIGS. 3 and 4, the hold down device with extended capture pawl mechanism 10 is shown in its nearly extended position. It will be seen from FIG. 4 and FIG. 2 that the cam surface 30, formed in the cylindrical sidewalls of cam bracket 12, functions to fix the position of the pawl 22 with respect to the hold down device 10 and pawl receptacle 32 as the knob 86 is turned for turning drive shaft 18 and drawing the pawl shaft 20 in or out along the inner chamber 128 of cam bracket 12. In the first, nearly extended position, the cam follower 26 rests within a first slot or flat 144 which is just wide enough to receive the cam roller 26. As knob 86 is turned in a clockwise direction, for example, to retract the pawl shaft 20 and pawl 22 into cam bracket 12, roller cam 26 is moved to the left (FIG. 9A) and urged against a first incline 146 by the preload from spring 24. This causes the pawl 22 to rotate approximately 45°, as shown in FIGS. 9 and 9A. The cam roller 26 next reaches a second flat 148 in cam surface 30 which establishes the pawl 22 in a pre-capture position.

As seen in FIG. 9, the pawl 22 has tapering surfaces 150 with rounded edges therebetween to form a cam. The pawl receptacle 32 may be mounted into a rack or orbiting platform shown schematically at 152 in FIG. 9. Receptacle 32 may be formed from a casting having a cam receiving aperture 154 which is generally rectangular in shape and slightly larger than the dimensions of pawl 22. Aperture 154 has surrounding, tapered walls 156 which act as a cam-receiving funnel to receive the camming surfaces 150 of pawl 22.

The pawl 22 shown in FIGS. 3 and 4 has a pair of hooks 22a and 22b extending to each side of pawl shaft 20. As seen in FIGS. 5 and 6, the pawl hooks 22a and 22b may be modified by tapering their inner surfaces closest to cam bracket 12 to form V-grooves 157 therein. These V-grooves 157 may, in turn, engage similar raised surfaces (not shown) cast into the inner surface of the cup-shaped casting that forms the pawl receptacle 32 to provide for a further positive locking between the pawl 22 and its receptacle 32.

As the equipment rack, chassis, or ORU 14, in which the hold down device 10 is mounted, approaches the rack or orbiting platform 152, pawl 22 is inserted into the tapering walls 156 of pawl receptacle 32. The camming action between the tapering walls 156 of receptacle 32 and the tapered surfaces 150 of pawl 22 rotate pawl shaft 20 from its pre-capture position and through a transition position against the urging of spring 24 as shown FIG. 10A. Note that the cam surface 30 has been relieved above the second flat 148 to permit the cam wheel 26 to move through the transition position to orient pawl 22 within the aperture 154, as shown in FIG. 11.

As pawl 22 is inserted further into the pawl receptacle 32, the pawl passes beyond the aperture 154 and rotates under the urging of spring 24 into the capture position as shown in FIG. 12. The direction of travel of the roller cam 26 is shown in FIG. 12A, while the orientation of pawl 22 in pawl receptacle 32 is shown in FIG. 13. p Further turning of knob 86 in a clockwise direction, for example, draws the pawl shaft 20 and its associated roller cam 26 over a second incline surface 158 into a third portion of cam surface 30 which is a third flat 159 that establishes the locked position of the pawl 22. The motion of the roller cam 26 as it enters the locked position is shown in FIG. 14A, while the position of the pawl 22 in pawl receptacle 32 is shown in FIG. 15.

The hold down device 10 provides a positive locking and unlocking as the knob 86 is tightened in the clockwise direction (if right-hand threads are used). As the pawl 22 is brought into locking engagement with pawl receptacle 32, as shown in FIG. 14, the clutch contact between clutch plate 36 and clutch drive disc 46 disengages due to the slippage of the clutch plate and disc over their ramped surfaces 40 and 40', respectfully. As the knob 86 is tightened and before the clutch slips, the ratchet teeth 68 and 74 begin to engage. Further tightening which causes the clutch plates to slip will establish the preload between the pawl 22 and pawl receptacle 32. The point at which the clutch slippage occurs is controlled by the design of the belleville spring washers 96 for establishing the pre-load.

Once tightening has ceased, the hold down device 10 is locked in its position because the stop surfaces 72' on ratchet teeth 74 of cam bracket 12 engage the stop surfaces 72 on the ratchet teeth 68 of ratchet cam 54 to prevent rotation of the ratchet cam. The flats 58 in aperture 56 of the ratchet cam 54 ride upon the flat surfaces 52 of the clutch drive disc 46 to prevent rotational motion therebetween. Next, the stop surfaces 44' on the clutch disc 46 engage the stop surfaces 44 on the clutch plate 36 of drive shaft 18 to prevent the rotation thereof. This arrangement locks the hold down device 10 against rotation for retaining the chassis 14 against its platform 152.

Rotation of knob 86 in a tightening direction (clockwise, for example) will cause the stop shoulders 88 on the knob 86 to engage the arcuate stop tabs 84 formed upon the drive plate 78. When the knob is turned in a loosening direction (counterclockwise, for example) stop tabs 84 and shoulders 90 permit the knob 86 to turn freely for slightly more than 90° before the stops 84 again engage the stop shoulders 90. This arrangement is shown in FIG. 7 wherein the stop tabs 84 are shown against the stop shoulder 90 before the knob 86 is turned int he loosening direction. Remember that a loosening direction is shown in the clockwise direction in FIGS. 7 and 8.

As seen in FIG. 8, the free turning in the clockwise direction of knob 86 permits the cam lugs 92 to ride over the ramp portions 62 of the cams 60 on ratchet cam 54 with moving clutch drive disc 46 until the stop tabs 84 again engage the stop shoulders 90. This freedom of rotation of knob 86, while the hold down device 10 is positively latched, will cause the cam lugs 92 to lift the ratchet cam 54 for disengaging the ratchet teeth 68 thereof from the ratchet teeth 74 of the cam bracket 12 to unlatch the hold down device 10.

When the time comes to unlock the hold down device 10, continuing counterclockwise rotation, for example, of knob 86 will also rotate the drive shaft 18 in a counterclockwise direction for urging the pawl shaft 20 to extend out of the cam bracket 12. This causes roller 26 to follow the cam surface 30 from the third flat area 158 over the second flat 148 to the first flat area 144, FIG. 16A. As full extension of pawl shaft 20 is reached as shown in FIG. 16, the pawl 22 engages a closure wall 160 connected to the back of pawl receptacle 32, as by screws 162. This contact produces a push-out force which helps to disengage the equipment rack or platform 152 to which the pawl receptacle 32 may be mounted from the chassis or ORU 14 in which the hold down device 10 is mounted. As seen in FIG. 17, the first flat 144 in cam surface 30 will hold the pawl 22 in the position shown for extraction through the aperture 154, as shown in FIG. 18.

From the foregoing description it will be seen that the hold down device with extended capture pawl mechanism 10 provides a pre-capture mode followed by a transition mode as the pawl 22 and receptacle 32 start to engage. Once engaged, the pawl 22 is urged into its capture mode by spring 24. The hold down device 10 may then be easily turned to assume a positive locking condition which places a preload between the hold down 10 on the chassis 14 and the receptacle 32 on the platform 152. Thereafter, the device 10 may be unlocked and will exert a push-off force between the chassis and platform. All of these activities are conducted while the pawl is under a positive control due to the threaded interface between the pawl shaft 20 and drive shaft 18. The hold down device 10 may be easily manipulated by hand or by a tool handled by an astronaut or by a robot. While the device as shown provides no clutching when loosened, it will be understood that the stop surfaces 44 and 44' of clutch plate 36 and clutch drive disc 46 may be easily arranged at a slight angle to permit a slippage between the clutch plates during loosening. In this configuration, the clutch plate will serve to prevent overload and damage in both the tightening and loosening directions of knob 86 rotation.

The extended capture mechanism formed by spring-loaded pawl shaft 20 and pawl 22 allows the hold down device 10 to be brought into place with pawl 22 engaging receptacle 32 without precise alignment. The engagement between pawl 22 and receptacle 32 may be accomplished easily in space by an astronaut in a bulky space suite or a robot with remote control.

While several modifications and variations of the present invention are possible, the present invention should be limited only by the appended claims.

We claim:

1. A hold down device for attaching a first member to a second member, comprising:
   a pawl shaft having a cam follower thereon and a pawl at one end adapted for mounting upon said first member;
   a cam bracket juxtaposed with said pawl shaft for engaging said cam follower;
   a spring for urging said pawl shaft and pawl into a pre-capture position;
   a pawl receptacle adapted for mounting upon said second member for receiving said pawl and urging said pawl shaft and pawl through a transition position against the urging of said spring into a capture position within said receptacle;
   a drive assembly for drawing said pawl shaft and pawl into a locked position within said receptacle for attaching said first and second members and a drive shaft threadably received within and aligned linearly with said pawl shaft.

2. The hold down device of claim 1, additionally comprising:
   said cam bracket surrounding said pawl shaft having a cam surface therein; and
   said cam follower on said pawl shaft engaging said cam surface.

3. The hold down device of claim 2, additionally comprising:
   said cam bracket formed as a hollow cylindrical tube surrounding said pawl shaft;
   said cam follower including a roller cam; and
   said cam surface formed as a slot within said cylindrical tube within which said roller cam fits;
   said cam surface having an unlocked position, a pre-capture position, and a locked position.

4. The hold down device of claim 3, wherein said cam surface further includes a relieved area about said pre-capture position which permits said roller cam to move from said pre-capture position through said transition position against the urging of said spring into said capture position.

5. The hold down device of claim 4, wherein:
   said pawl shaft has a longitudinal axis and is moved along its longitudinal axis by said drive shaft from said unlocked position to said locked position, and
   said drive shaft mounts said pawl shaft within said drive assembly for rotational motion about said longitudinal axis as said pawl engages said pawl receptacle to rotationally move said pawl from said pre-capture position through said transition position into said capture position.

6. The hold down device of claim 5, wherein:
   said pawl receptacle includes a pawl receiving aperture having tapering sidewalls that engage said pawl as said pawl is received thereby and cause said pawl to rotate about said drive shaft.

7. The hold down device of claim 6, wherein:
   said pawl receptacle includes a closure wall opposite from said pawl receiving aperture which is engaged by said pawl as it approaches said unlocked position to provide a push-off force to said hold down device.

8. The hold down device of claim 2, wherein said drive assembly includes:
   a clutch plate extending from said drive shaft;
   a clutch drive disc engaging said clutch plate;
   springs for urging said clutch drive disc against said clutch plate; and
   a knob for rotating said drive shaft upon said pawl shaft, rotation of which adjusts said cam follower in said cam surface to adjust said pawl into said lock position whereby said clutch plate and said clutch drive disc will slip under the urging of said springs to limit the forces between said pawl and pawl receptacle.

9. The hold down device of claim 8, additionally comprising:
   a ratchet cam slidably mounted upon said clutch drive disc having a plurality of ratchet teeth;
   said cam bracket having a plurality of ratchet teeth;

said ratchet teeth on said ratchet cam and said ratchet teeth on said cam bracket having ramp surfaces and stop surfaces which permit slippage therebetween as said knob is tightened and provide self-locking of said knob.

10. The hold down device of claim 9, additionally comprising:

said ratchet cam having cam surfaces;

said knob having lugs extending inwardly which engage said cam surfaces on said ratchet cam for disengaging said ratchet teeth of said ratchet cam and said cam bracket when said knob is rotated in a loosening direction to defeat said self-locking of said knob.

11. A hold down device for an equipment rack, comprising:

a drive shaft;

a pawl shaft having a cam follower thereon connected to said drive shaft;

spring means for urging said pawl shaft in at least one predetermined direction;

a cam bracket juxtaposed with said pawl shaft having a cam surface which interacts with said cam follower on said pawl shaft to urge said pawl shaft in at least one direction other than said predetermined direction;

a pawl receptacle adapted for mounting in said rack for receiving said pawl shaft said drive shaft is threaded at one end; and said pawl shaft has a longitudinal axis and is internally threaded along its longitudinal axis to receive said drive shaft whereby rotation of said drive shaft causes the movement of said pawl shaft along its longitudinal axis.

12. The hold down device of claim 11, wherein:

said cam bracket is a cylindrical surrounding said pawl shaft;

said cam surface is a cam-shaped slot in said cylindrical tube having a locked position and an unlocked position on each end of the cam slot and a precapture position therebetween.

13. The hold down device of claim 12, wherein:

said cam follower on said pawl shaft has at least one roller cam extending therefrom and into said cam slot; and said pre-capture position in said cam slot is enlarged to permit said pawl shaft to rotate from a pre-capture position to a transition position to a capture position under the urging of said spring means.

14. The hold down device of claim 11, wherein:

said pawl has two hooks, one on each side of said pawl shaft; and said pawl receptacle has a tapered, cam opening to receive said pawl hooks.

15. A hold down device for attaching a first member to a second member, comprising:

a drive shaft having first and second ends;

a drive assembly mounted upon said first end of said drives shaft, adapted for attaching said drive shaft to said first member;

a pawl shaft having first and second ends with its first end mounted upon said second end of said drive shaft and a pawl mounted upon said second end of said pawl shaft;

a cam bracket surrounding said drive shaft and pawl shaft having at least one cam surface therein;

spring means for urging said pawl shaft in a predetermined direction;

said pawl shaft having cam follower means extending into said cam surface for retaining said pawl shaft and said pawl in a predetermined position upon said cam surface against the urging of said spring means in said predetermined direction; and a pawl receptacle adapted for mounting upon said second member for receiving said pawl and for forcing said pawl out of its said predetermined position upon said cam surface and in a direction opposite to said predetermined direction against the urging of said spring means until said pawl passes into said receptacle whereupon said pawl is urged by said spring mean sin said predetermined direction back into its said predetermined position where it is adapted for attaching said first member to said second member.

16. The hold down device of claim 15, wherein:

said cam surface has at least first, second, and third surfaces which retain said cam follower thereon; and said drive assembly is connected to said drive shaft so that the turning thereof draws said pawl shaft and said cam follower along said first, second, and third cam surfaces to position said pawl in first, second, and third positions.

17. The hold down device of claim 16, wherein:

said cam surface is relieved at said second surface to permit said pawl to move from its said predetermined position as said pawl is received in said receptacle.

18. The hold down device of claim 15, wherein:

said drive assembly is a drive knob attached to said drive shaft by a clutch to establish a preload between said first and second member.

19. The hold down device of claim 15, wherein:

said pawl has a cam surface thereon; and said pawl receptacle has a tapered opening for receiving said cam surface of said pawl.

* * * * *